（12）United States Patent
Sato

(10) Patent No.: US 7,401,004 B2
(45) Date of Patent: Jul. 15, 2008

(54) SYSTEM FOR REVIEWING DEFECTS, A COMPUTER IMPLEMENTED METHOD FOR REVIEWING DEFECTS, AND A METHOD FOR FABRICATING ELECTRONIC DEVICES

(75) Inventor: Yoshiyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/367,360

(22) Filed: Mar. 6, 2006

(65) Prior Publication Data

US 2006/0199286 A1 Sep. 7, 2006

(30) Foreign Application Priority Data

Mar. 7, 2005 (JP) ............................ P2005-062479

(51) Int. Cl.
*G06F 19/00* (2006.01)

(52) U.S. Cl. ............................ 702/185; 702/82; 702/84; 700/109; 700/110

(58) Field of Classification Search .............. 702/81–84
See application file for complete search history.

(56) References Cited

U.S. PATENT DOCUMENTS

| 5,598,341 | A | * | 1/1997 | Ling et al. | .................. | 700/110 |
| 6,483,938 | B1 |  | 11/2002 | Hennessey et al. |  |  |
| 6,556,955 | B2 | * | 4/2003 | Yoshitake et al. | ............ | 702/185 |
| 6,775,817 | B2 | * | 8/2004 | Ono et al. | ..................... | 716/21 |
| 2004/0223639 | A1 | * | 11/2004 | Sato | .......................... | 382/145 |

* cited by examiner

*Primary Examiner*—Manuel L Barbee
(74) *Attorney, Agent, or Firm*—Finnegan, Henderson, Farabow, Garrett & Dunner, L.L.P.

(57) ABSTRACT

A system for reviewing defects includes an analysis module configured to analyze defect information of a plurality of intermediate products, the defect information including information of an amount of defects classified by sizes of the defects existing in each of the intermediate products; a failure magnitude calculation module configured to calculate a systematic failure magnitude of the intermediate products caused by fabrication procedure of the intermediate products; a classification module configured to classify a calculated result of the systematic failure magnitude; and a review target selection module configured to select intermediate products becoming review targets.

12 Claims, 14 Drawing Sheets

SYSTEM FOR REVIEWING DEFECTS, A COMPUTER IMPLEMENTED METHOD FOR REVIEWING DEFECTS, AND A METHOD FOR FABRICATING ELECTRONIC DEVICES

CROSS REFERENCE TO RELATED APPLICATIONS AND INCORPORATION BY REFERENCE

This application is based upon and claims the benefit of priority from the prior Japanese Patent Applications No. P2005-62479, filed on Mar. 7, 2005; the entire contents of which are incorporated herein by reference.

BACKGROUND OF THE INVENTION

1. Field of the Invention

The present invention relates to a defect reviewing system, more specifically to a system for reviewing defects, a computer implemented method for reviewing defects, and a method for fabricating electronic devices.

2. Description of the Related Art

In a fabricating technology for electronic devices, for maintaining and improving a fabrication yield, it is necessary to ascertain a cause of a failure of the electronic device at an early stage and to feed back the cause of the failure to a specific fabricating process and a specific fabricating apparatus. In order to ascertain the cause of the failure at the early stage in the fabrication procedure, it is required to detect as many defects as possible occurring on the intermediate products of the electronic devices.

The defect review is an operation for classifying the defects detected by the defect inspection apparatus for each failure factor by observing the detected defects by use of an optical microscope, a scanning electron microscope (SEM) and the like. A result of the defect review can serve as a very important information source for identifying the failure cause.

However, in recent years, the number of detected defects has been sharply increased by performance improvement of the defect inspection apparatus and size enlargement of a wafer. Hence, a load on the defect review has been increased. Since there has not been a method for efficiently sampling the killer defects under the current situation, oversight of serious defects required to be detected may occur, and may cause a delay in the improvement of the fabrication yield with the increase of the test object.

For this reason, a method has been proposed, which is capable for efficiently reviewing the killer defects from among the enormous number of detected defects and identifying a fabricating process and a fabricating apparatus having problems at an early stage. However, to improve the yield more, it is required to find out that the detected killer defects are generated in the producing systems or adhesion of dust. Moreover, it is desired to develop a reviewing system, which can select review objects freely, depending on the conditions set by the user.

SUMMARY OF THE INVENTION

An aspect of the present invention inheres in a system for reviewing defects, encompassing an analysis module configured to analyze defect information of a plurality of intermediate products by using an analysis equation, the defect information including information of an amount of defects classified by sizes of the defects existing in each of the intermediate products, respectively; a failure magnitude calculation module configured to calculate a systematic failure magnitude of the intermediate products caused by fabrication procedure of the intermediate products by using the analysis equation and the analyzed result of the defect information; a classification module configured to classify a calculated result of the systematic failure magnitude with respect to each of the intermediate products; and a review target selection module configured to select intermediate products becoming review targets, based on a classified result.

Another aspect of the present invention inheres in a computer implemented method for reviewing defects, encompassing analyzing defect information of a plurality of intermediate products by using an analysis equation, the defect information including information of an amount of defects classified by sizes of the defects existing in each of the intermediate products, respectively; calculating a systematic failure magnitude of the intermediate products caused by fabrication procedure of the intermediate products by using the analysis equation and the analyzed result of the defect information; classifying a calculated result of the systematic failure magnitude with respect to each of the intermediate products; and selecting intermediate products becoming review targets, based on a classified result, Still another aspect of the present invention inheres in a method for fabricating electronic devices, encompassing conducting a fabrication procedure on a plurality of process bases so as to provide a plurality of intermediate products; inspecting a plurality of inspection points allocated on the intermediate products so as to extract defects; generating defect information by classifying sizes of the defects existing in each of the intermediate products, respectively; analyzing the defect information by using an analysis equation, calculating a systematic failure magnitude of the intermediate products caused by the fabrication procedure, classifying a calculated result of the systematic failure magnitude of intermediate products, selecting a plurality of intermediate products becoming review targets, and reviewing the review targets; and determining whether or not the intermediate products undergo a next stage of the fabrication procedure based upon the reviewed result.

DETAILED DESCRIPTION OF THE INVENTION

Figure 1:
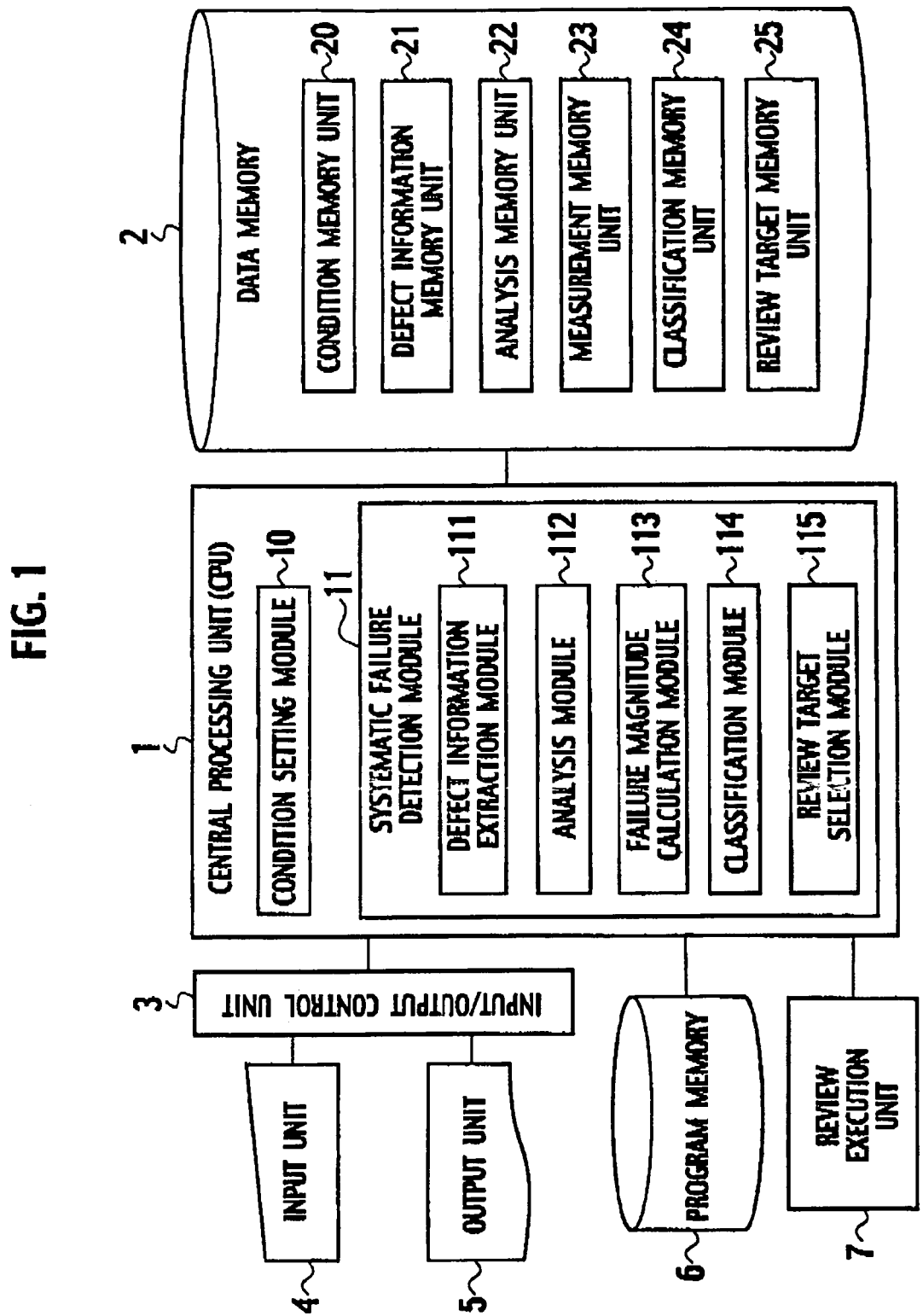
FIG. 1 is a block diagram illustrating a system for reviewing defects according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth such as specific signal values, etc. to provide a thorough understanding of the present invention. However, it will be obvious to those skilled in the art that the present invention may be practiced without such specific details.

First Embodiment

As shown in FIG. 1, a system for reviewing defects according to a first embodiment of the present invention includes a central processing unit (CPU) 1, a data memory 2, an input/output control unit 3, an input unit 4, an output unit 5, a program memory unit 6, and a review execution unit 7. The CPU 1 processes a variety of operations. The data memory 2 stores therein operation processing results of the CPU 1 and the like. The input unit 4 and the output unit 5 are connected to the CPU 1 through the input/output control unit 3. The program memory unit 6 stores therein a variety of programs, which are necessary for the operation processing, defect inspection and the like. The review execution unit 7 reviews to inspect intermediate products on the basis of the operation processing results of the CPU 1.

Here, "intermediate product" refers to intermediate products of a certain stage during a fabrication process, for example semiconductor substrates (semiconductor wafer) with regard to the fabrication of semiconductor devices, liquid crystal substrates with regard to the fabrication of liquid crystal devices, resin substrates with regard to the fabrication of magnetic memory media or laser memory media, magnetic material substrates with regard to a fabrication of thin film magnetic heads, piezoelectric material substrates with regard to the fabrication method for ultra-sonic wave elements, superconductive material substrates with regard to the fabrication method for superconductive elements, and the like.

Therefore, as for the intermediate product, a variety of inorganic materials such as an inorganic variety of synthetic raisin, semiconductor, metal, ceramics, glass and the like can be selected depending on the kind of the intended fabricate (industrial product). Most of intermediate products are called "fabrication substrate", being intermediate products of the shape of a board such as semiconductors and the like, however, they need not necessarily have the shape of a board. A variety of shapes, such as the shape of a block and the like, can be applied in accordance with the intended kind of fabricate (industrial product). In the case of a semiconductor wafer and the like, the expression "intermediate product" may include a laminated structure implemented by a thin film deposited on a semiconductor wafer as a base material, in a narrow sense.

The CPU 1 includes a condition setting module 10, which sets each review condition necessary for selecting specific intermediate products out of a plurality of intermediate products as review targets, and a systematic failure detection module 11, which detects systematic failures due to the processing operation of intermediate products.

The data memory 2, which is connected to the CPU 1, includes a condition memory unit 20, defects information memory unit 21, an analysis memory unit 22, a measurement memory unit 23, a classification memory unit 24, and a review target memory unit 25.

The condition setting module 10 shown in FIG. 1, sets the conditions required by the user for the review, for example, conditions of the kind of purpose for the review (review target), such as the number of samples, the inspection target domain and the area thereof, and the like, and the analysis conditions and the like of the analysis equation, which is necessary for the selection of the review target, and stores the setting result into the condition memory unit 20.

Figure 2A:
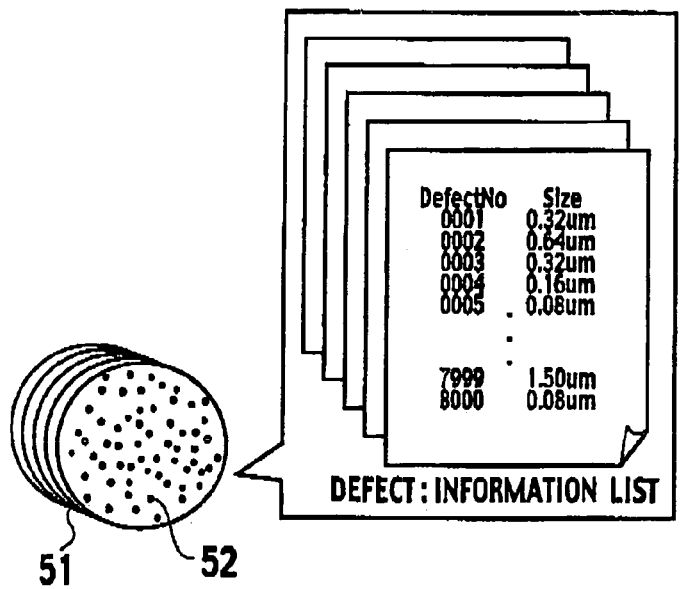
FIG. 2A is a schematic diagram illustrating an example list of defect information according to the first embodiment of the present invention.

The condition setting module 10 further stores the defect inspection information obtained from the inspection result of the intermediate product into the defect information memory unit 21, as shown in FIG. 2A. In this specification, a wafer, which has been undertaken a predetermined operation, is explained as one example of an intermediate product. In case of a semiconductor wafer, with the proceeding of the operation, a stacking of thin films may occur, however, in this specification such a laminated structure of thin films is also called "wafer" and is object to the expression "intermediate product".

Figure 2B:
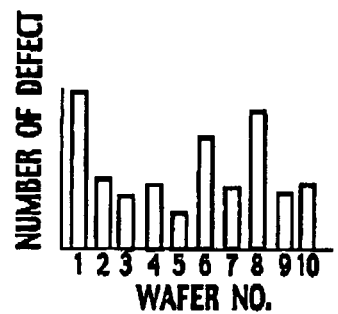
FIG. 2B is a graph illustrating a distribution of number of defects for each wafer number according to the first embodiment of the present invention.

As shown in FIG. 2A, in the defect information memory unit 21, a list of defect information is stored containing the number of defects 52 existing on a plurality of wafers 51, which have been undertaken a predetermined operation, coordinate information, size, and the like. In the defect information memory unit 21, there is also stored the distribution information of the number of defects distinguished by numbers of, for example, 10 pieces of wafers 51, as shown in FIG. 2B.

Figure 2C:
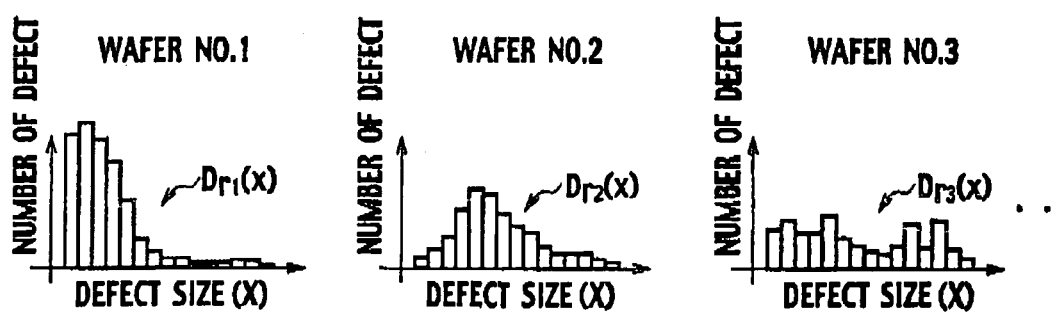
FIG. 2C is a graph illustrating a distribution of defect size Dr(X) for each wafer size (X) according to the first embodiment of the present invention.

Furthermore, as shown in FIG. 2C, also information of the defect size distribution Dr(X) of defects 52 existing on number distinguished wafers 51, classified by their size, are stored.

The systematic failure detection module 11 of FIG. 1 includes defects information extraction module 111, an analysis module 112, a failure magnitude calculation module 113, a classification module 114 and a review target selection module 115. The defect information extraction module 111 extracts the information on the defect size distribution Dr(X) of wafer 51, which is stored in the defect information memory unit 21, as shown in FIG. 2C.

Figure 2D:
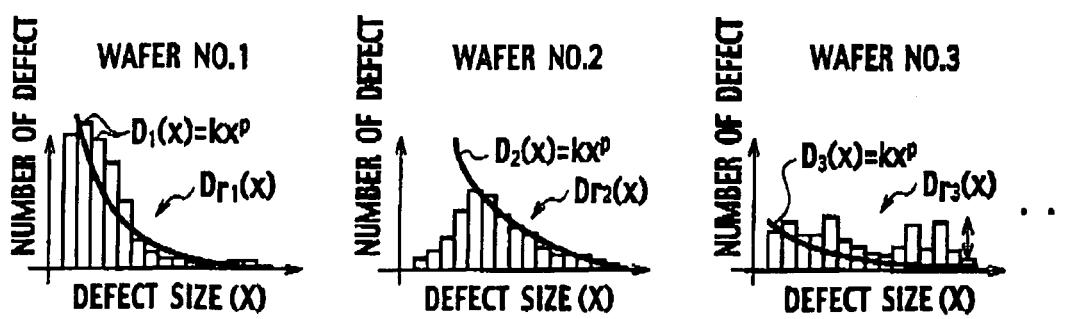
FIG. 2D is a graph illustrating a fitting result of the distribution of defect size Dr(X) by use of a fitting function D(X) for each wafer size (X) according to the first embodiment of the present invention.

The analysis module 112 retrieves from the condition memory unit 20 the analysis equation, and performs with regard to the defect size distribution Dr(X) extracted by the defect information memory unit 21, for example as shown in FIG. 2D, a fitting by using a fitting function D(X) as shown below:

$$D(X)=k \times X_p \qquad (1)$$

Here, "k" and "p" are arbitrary constants. Fitting function D(X) shown in equation (1) refers to one example of a fitting function based on a "random failure" due to the adhesion of dust and the like in the fabrication process. Analysis module 112 analyzes the defect size distribution Dr(X) using the fitting function D(X) of equation (1), whereby it can be distinguished, whether the failure cause of the wafer as intermediate product depends on the random failure or on the systematic failure due to the failure of the device.

In particular, in case that, for example as shown in the graph of wafer No. 2 of FIG. 2D, the curved line of fitting function $D_2(X)$ almost coincides with the graph of the defect size distribution $Dr_2(X)$, this indicates that the defect occurring on wafer No, 2 is due to the random failure. On the other hand, in case that the curved line of fitting function $D_3(X)$, as shown in the graph of wafer No. 3 of FIG. 2D does not coincide with the graph of the defect size distribution $Dr_3(X)$, this indicates that at wafer No. 3 only the part deviating from the curved line of the fitting function $Dr_3(X)$ has occurred a systematic failure. The analysis information of each wafer 51 is stored in the analysis memory unit 22.

The failure magnitude calculation module 113 calculates on the basis of the analysis equation of each wafer 51 analyzed by analysis module 112, as shown below, a difference E between an actucally observed defect size distribution Dr(X) and the fitting function D(X) with regard to each wafer 51. Herewith, the failure magnitude calculation module 113 calculates as systematic failure magnitude the number of defects, which do not coincide with the curved line of the fitting function D(X):

$$E=\int |Dr(X)-D(X)|dX \qquad (2)$$

The calculation result of the systematic failure magnitude is stored in the measurement memory unit 23.

Figure 3A:
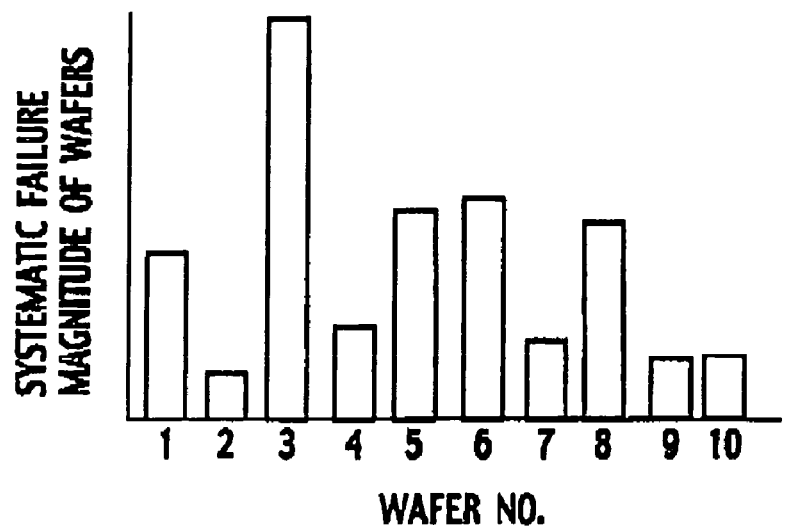
FIG. 3A is a graph illustrating a system failure magnitude of wafers caused by wafer fabrication processes for each wafer number.

The classification module 114 classifies by the number of each wafer 51, as shown in FIG. 3A, the calculation result of the systematic failure magnitude of each of wafers 51 becoming the target for inspection, and stores the classification result in the classification memory unit 24. The review target selection module 115 selects on the basis of the review conditions stored in the condition memory unit 20 and the classification result stored in the classification memory unit 24, as shown for example in FIG. 3B, in descending order from wafers with a great systematic failure magnitude, a plurality of plies of review targets, and stores the selection result in a review target memory unit 25.

The input unit 4 in FIG. 1 includes a keyboard, a mouse, a light-pen, a flexible disc device and the like. The user can specify the input/output data from the input unit 4, and the setting of review conditions, analysis conditions and the like is possible. As for the output unit 5, a display, a printer or a recording apparatus and the like for storing on a computer readable memory medium, can be used. "Computer readable memory medium" includes, for example, an external memory device for computers, a semiconductor memory, a magnetic disc, a laser disc, a cassette tape an open reel tape, or the like.

Figure 4:
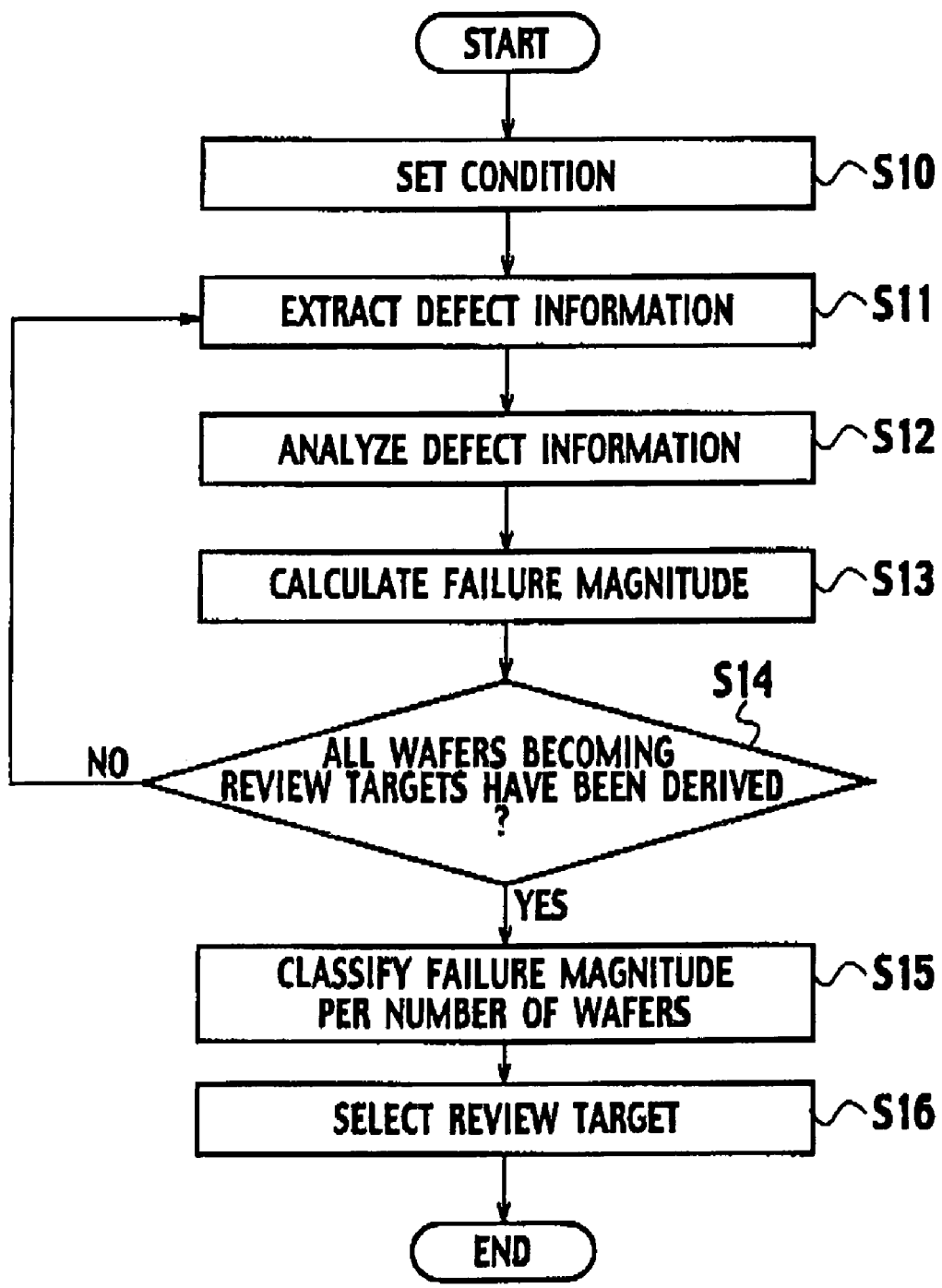
FIG. 4 is a flowchart illustrating a method for reviewing defects according to the first embodiment of the present invention.

The method for reviewing the defect according to the first embodiment is explained by use of the flowchart of FIG. 4.

In step S10 of FIG. 4, the conditions and the like required by the user, such as the review target, the number of samples, the inspection target domain and the area thereof, and the like, as well as the analysis conditions needed for the review, are input into the CPU 1 of FIG. 1 through input unit 4. The condition setting module 10 sets each kind of condition input from the input unit 4 and stores the setting result into the condition memory unit 20. The condition setting module 10 extracts defects from each point on each wafer, sets the defect size distribution Dr(X) for each wafer, and stores the defect size distribution Dr(X) into the defect information memory unit 21. In case the information of the defect size distribution Dr(X) has been saved beforehand into another database, the database can also be used.

In step S11, the defect information extraction module 111 extracts the information of the defect size distribution Dr(X) of wafers 51, which is stored within the defect information memory unit 21. Next, the case is explained, where the defect information extraction module 111 has extracted the defect size distribution $Dr_1(X)$ of wafer No. 1 shown in FIG. 2C.

In step S12, the analysis module 112 reads out the information of defect size distribution $Dr_1(X)$ shown in FIG. 2C, and the analysis equation shown in equation (1), which is stored within the condition memory unit 20, and analyzes the fitting function $D_1(X)$ as shown in FIG. 2D. The analysis result of wafer No. 1 is stored into analysis memory unit 22.

In step S13, the failure magnitude calculation module 113 reads out the analysis result of wafer No. 1 from the analysis memory unit 22, and the equation (2) from condition memory unit 20, respectively. The failure magnitude calculation module 113 calculates, on the basis of equation (2), the difference E between the defect size distribution $Dr_1(X)$ and the fitting function $D_1(X)$ as systematic failure magnitude. The calculation result of the systematic failure magnitude is stored into the measurement memory unit 23.

In step S14, the defect information extraction module 111 reads out the calculation result of the systematic failure magnitude, which is stored within the measurement memory unit 23, and the defect information of the wafer, which is stored within the defect information memory unit 21, and determines, whether or not the systematic failure magnitude of all wafers becoming review targets has been derived. When the failure magnitude of all wafers has been derived, the operation proceeds to step S15. In case the failure magnitude of all wafers has not yet been derived, the operation proceeds to step S11.

In step S15, the classification module 114 reads out the calculation result of the failure magnitude stored within the measurement memory unit 23, and classifies per number of wafers 51, as shown in FIG. 3A, the failure magnitude in view of all wafers 51 becoming inspection targets. The classification result is stored into the classification memory unit 24.

Figure 3B:
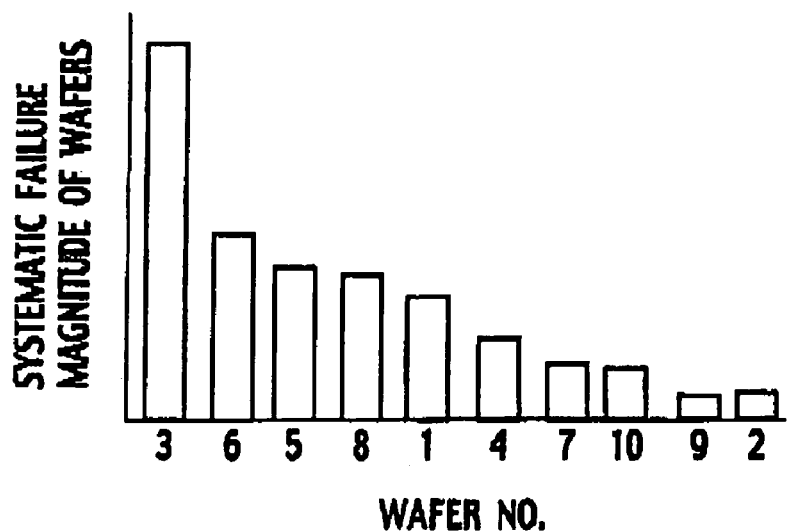
FIG. 3B is a graph illustrating a classification result in order of decreasing the system failure magnitude of wafers.

In step S16, the review target selection module 115 reads out the number of samplings stored within the condition memory unit 20, and the classification result stored within the classification memory unit 24. The review target selection module 115 selects on the basis of the classification result, as shown in FIG. 3B, in descending order from wafers 51 with a great systematic failure magnitude, for example, wafer Nos. 3, 6 and 5 of wafers 51 as review target, and stores the selection result into the review target memory unit 25. Thereafter, the defect cause of the wafers becoming a review target is reviewed by the review execution unit 7.

With regard to the presently usable defect review method, when performing the selection of review targets for the purpose of detecting systematic failures, a review has to be performed for all samples, for which the defect inspection is finished. In case the defect inspection information becomes voluminously, the review is performed preferentially in the order of wafer Nos. 1, 8, 6, . . . having a great amount of defects, as shown in FIG. 2B. On the other hand, with regard to the defect review method according to the first embodiment, as shown in FIG. 2D, the defect size distribution Dr(X) of each wafer 51 is fitted by the fitting function D(X) shown in equation (2), and analyzed. Therefore, as shown in FIG. 3B, the review is possible by predicting preferentially wafers having in fact a high occurrence of systematic failures (wafer Nos. 3, 6, 5), whereby it is possible to review significant failures caused by the fabrication process out of detected defects at a high speed and with a high efficiency.

Second Embodiment

Figure 5:
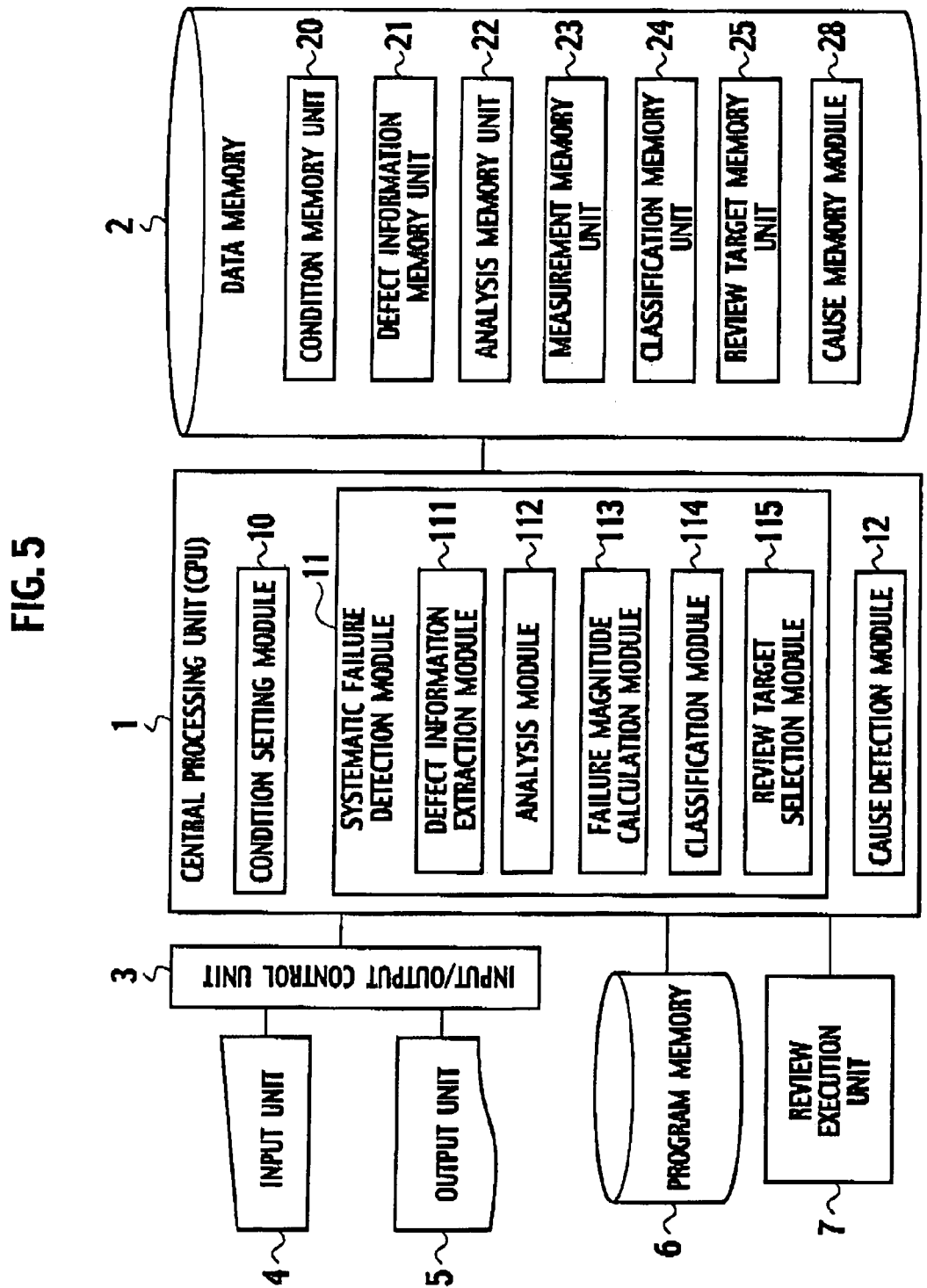
FIG. 5 is a block diagram illustrating a system for reviewing defects according to a second embodiment of the present invention.

As shown in FIG. 5, the system for reviewing the defect according to a second embodiment differs from the system shown in FIG. 1 in that there is further provided a cause detection module 12 detecting the cause of defects based on the review result of the review execution unit 7, and a cause memory unit 28 for storing the detection result of the cause detection module 12.

In the review target memory unit 25, shown in FIG. 5, as a review target, the defect size distribution information of the wafer with the greatest number of systematic failure magnitude and the defect size distribution information of the wafer with the least, respectively, are stored as a review target. In the example of the graph shown in FIG. 3B, for example, the information of wafer No. 3 and wafer No. 2 are stored into the review target memory unit 25. Then, the review execution unit 7 reviews wafer No. 2 and wafer No. 3 on the basis of the wafer information stored within the review target memory unit 25.

Figure 6:
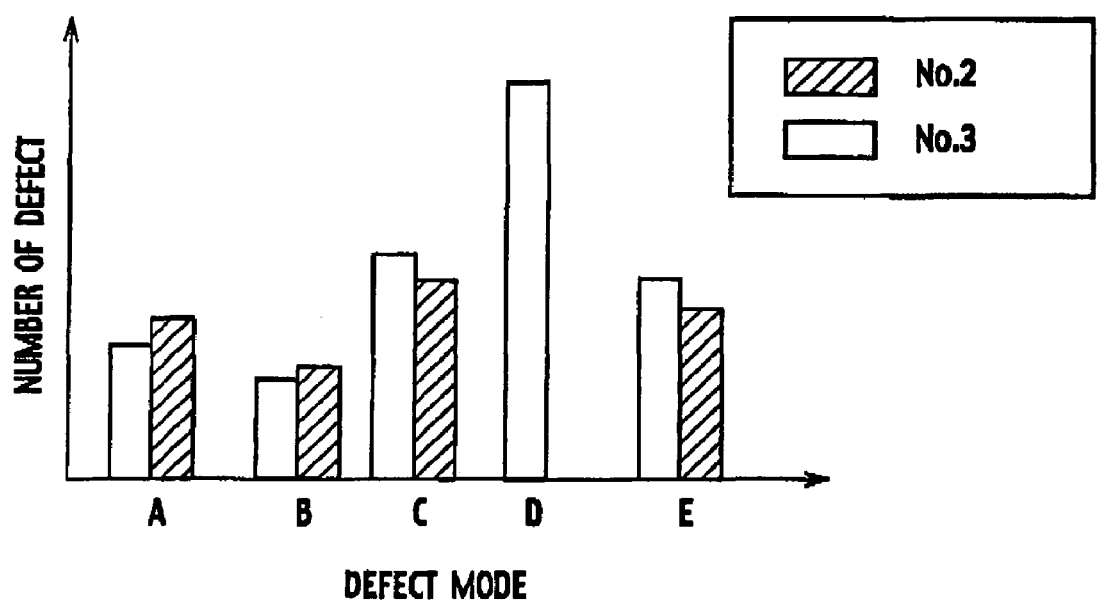
FIG. 6 is a graph illustrating a relationship between the defect mode and the number of defects.

The cause detection module 12 reads out the review result performed by the review execution unit 7, and detects the execution result for each of defect modes A, B, C, D and E, as shown in FIG. 6. Here, "defect modes A to E" refers to the kind of defect, observed/classified by the review execution unit 7, including, for example, failures due to fabricating processes such as etching, planarization, lithography process, stacking and the like. The failure mode detection result is stored into the cause memory unit 28.

As shown for wafer No. 6 and No. 3 of FIG. 3B, in case of extracting a plurality of wafers in the order from the ones with the most systematic failures, it is possible that the failure modes A to E show nearly the same distribution even if reviewed by the review execution unit 7. Therefore, there may be the case where it is difficult to differentiate in which fabrication process the failure has occurred. On the other hand, according to the failure review system shown in FIG. 5, wafer No. 3 with the highest systematic failure magnitude and wafer No. 2 with the lowest one, are automatically reviewed. Thus, as shown in FIG. 6, the failure mode (in FIG. 6 this is failure mode D) becoming the cause for systematic errors can easily be discriminated. As stated above, by the failure review system according to the second embodiment, failure causes having a high influence on the yield, can be efficiently reviewed. Therefore, the specification of a failure cause due to a fabrication process can be performed fast and without difficulty.

Figure 7:
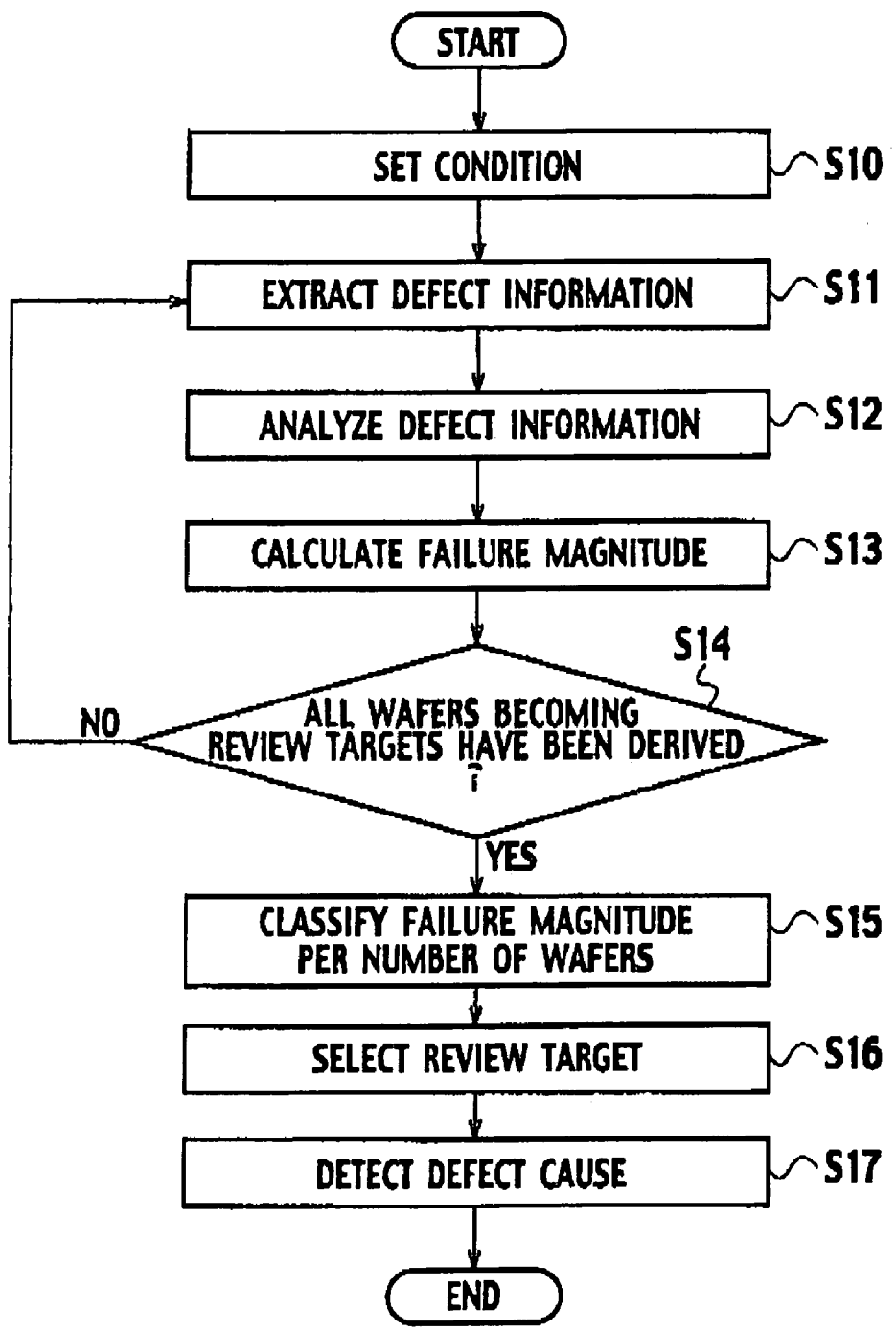
FIG. 7 is a flowchart illustrating a method for reviewing defects according to the second embodiment of the present invention.

Next, the method of reviewing the defect according to the second embodiment is explained by means of a flowchart shown in FIG. 7. However, since the method shown in steps 10 to 15 is substantially the same as the method shown in FIG. 4, the explanation thereof is omitted.

In step S16, the review target selection module 115 reads out the number of samplings stored within the condition memory unit 20, and the classification result stored within the classification memory unit 24. The review target selection module 115 selects as a review target, on the basis of the classification result, as shown in FIG. 3B, wafer No. 3 with a high failure magnitude and wafer No. 2 with the lowest failure magnitude, and stores the selection result into the review target memory unit 25. The review execution unit 7 reads out the selection result of the review target from the review target memory unit 25, and performs the failure review. Then, in step S17 the cause detection module 12 reads out the cause analysis information for performing the cause analysis stored within the condition memory unit 20, and the defect cause is detected on the basis of the review execution result employing the review execution unit 7, as shown in FIG. 6.

As described above, by the method of reviewing the defect according to the second embodiment, as a review target, wafer 51 with the highest systematic failure magnitude and wafer 51 with the lowest systematic failure magnitude are compared, such that it can be easily specified at which process the systematic failure magnitude has occurred. Therefore, a failure cause due to the fabrication process can be discovered fast and easily.

Third Embodiment

Figure 8:
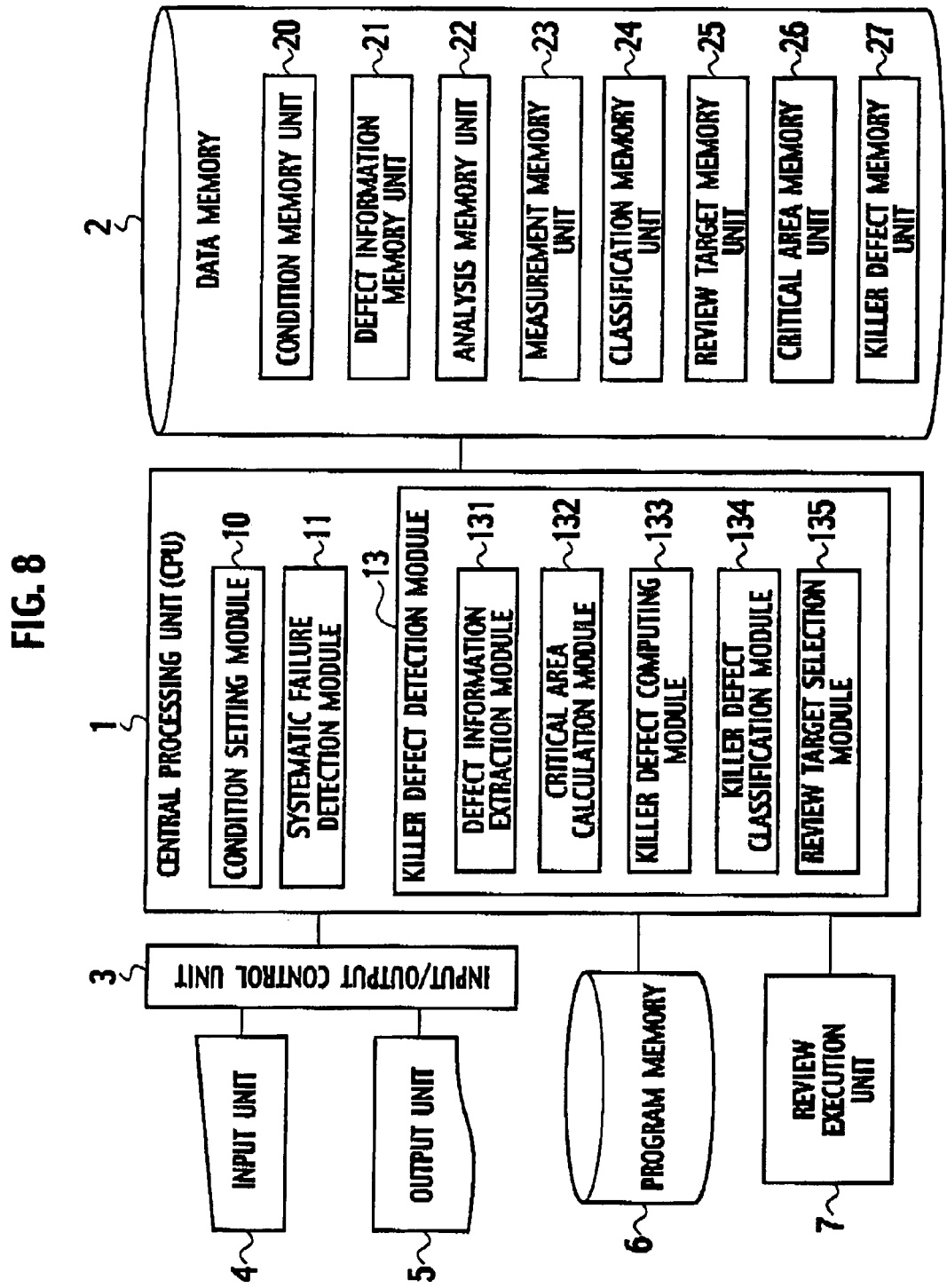
FIG. 8 is a block diagram illustrating a system for reviewing defects according to a third embodiment of the present invention.

As shown in FIG. 8, the system for reviewing the defect according to a third embodiment differs from the system shown in FIG. 1 in that there is further provided a killer defect detection module 13 for detecting killer defects contained in intermediate products. The data memory 2 is further provided with a critical area memory module 26 and a killer defect memory unit 27.

Figure 9A:
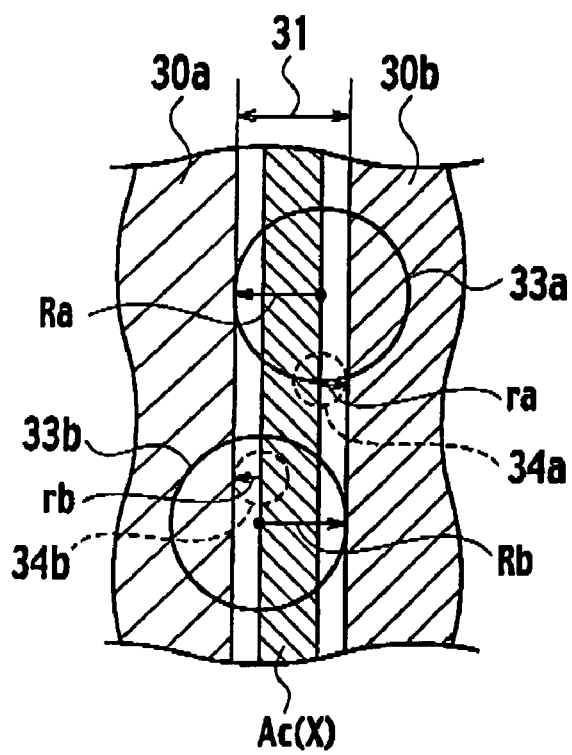
FIG. 9A is a schematic diagram illustrating a calculating method of a critical area calculated by a critical area calculation module according to the third embodiment of the present invention.

The killer defect detection module 13 includes defects information extraction module 131, a critical area calculation module 132, a killer defect computing module 133, a killer defect classification module 134 and a review target selection module 135. The defect information extraction module 131 extracts the information of the defect size distribution Dr(X) of a wafer 51 stored within the defect information memory unit 21. The critical area calculation module 132 calculates a critical area Ac(X) per wafer 51 on the basis of the defect size distribution Dr(X) information and the analysis information stored within the analysis memory unit 22. Here, critical area Ac(X) refers to the digitalization of a region in which a failure may occur due to the presence of defects, and is calculated, for example, as follows:

In case that, as shown in FIG. 9A, on a space 31 between a wiring 30a and a wiring 30b, extending in parallel to each other, a round shaped defect 33a with a radius Ra exists, a defect 33a may provide conduction between wirings 30a and 30b, and may cause a short circuit failure. Correspondingly, a round-shaped defect 33*b* with a radius Rb (whereby Ra=Rb), which partly overlaps with wiring 30*a*, may provide conduction between wirings 30*a* and 30*b*, and may cause a short circuit failure. As described above, the critical area Ac(X) of round shaped defects 33*a*, 33*b*, having a radius of Ra, Rb, is an area, in which the danger exists that a conduction between wirings 30*a*, 30*b* occurs, i.e. this area is calculated as the hatched area indicated over space 31.

On the other hand, since a defect 34*a*, which exists within a round shape of a radius ra on space 31, does not extend between wirings 30*a*, 30*b*, those wirings 30*a*, 30*b* are not conducted. Correspondingly, since also a defect 34*b*, which exists within a round shape of a radius rb (whereby rb=ra) on space 31, does not extend between wirings 30*a*, 30*b*, those wirings 30*a*, 30*b* are not conducted. In this case the critical area Ac(X) of round shaped defects 34*a*, 34*b* having a radius of ra, rb is calculated as "0".

Figure 9B:
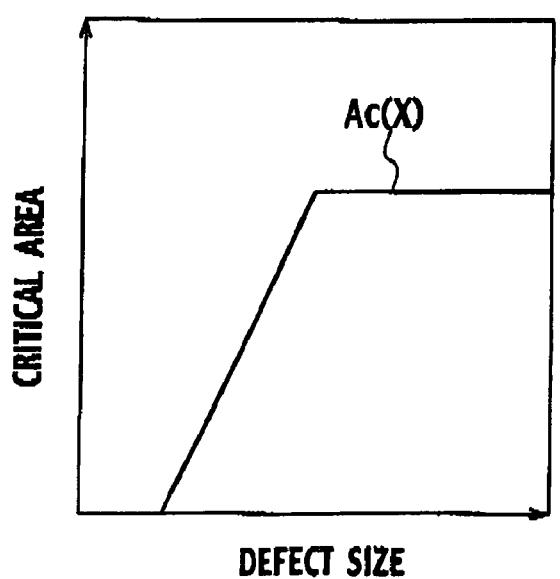
FIG. 9B is a graph illustrating a relationship between the critical area and the size of the defect existing in a wafer.

FIG. 9B shows a graph in which the relation between the defect size X of defects 33*a*, 33*b*, 34*a* and 34*b* as exemplified in FIG. 9A and the critical area Ac(X) is digitalized. As shown in FIG. 9B, critical area Ac(X) becomes larger as the failure size X grows. When the failure size X exceeds a certain value, the critical area Ac(X) takes the same value. The critical area calculation module 132 calculates the critical area Ac(X) of the wafer based on the information of the failure size distribution Dr(X) of the wafer becoming the inspection target and the analysis information stored within the analysis memory unit 22, and stores the calculation result into a critical area memory unit 26.

Figure 10A:
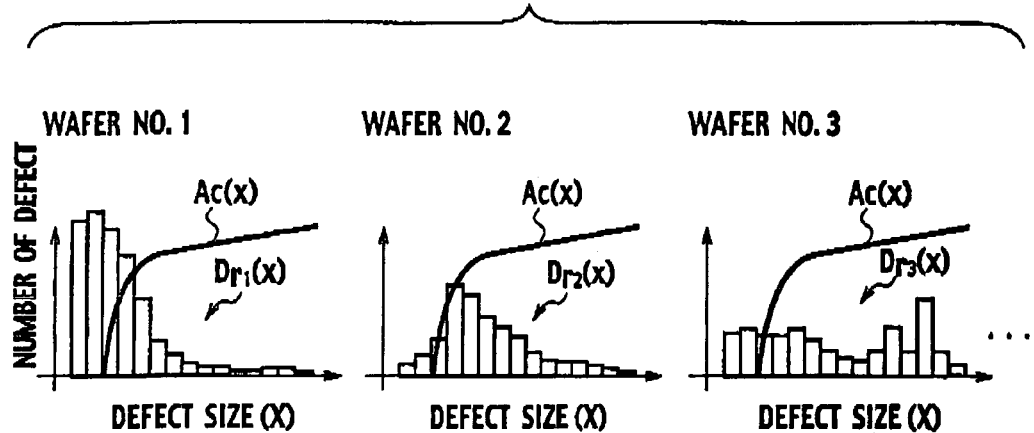
FIG. 10A is a graph illustrating a relationship between the distribution of defect size Dr(X) for each defect size (X) and the critical area Ac(X)
Figure 10B:
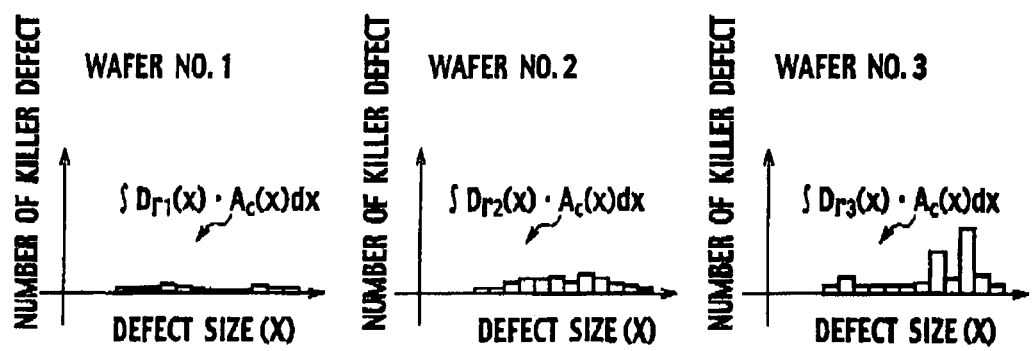
FIG. 10B is a graph illustrating number of a killer defect on the basis of the defect size (X) for each defect size (X)

As shown in FIG. 10A, the killer defect computing module 133 reads out the critical area Ac(X) calculated by the critical area calculation module 132 and the defect size distribution Dr(X) stored in the defect information memory unit 21. Then, as shown in FIG. 10B, the killer defect computing module 133 computes the number of killer defects λ employing equation (3) below for each of the inspection target wafers:

$$\lambda(X) = \int Ac(X) \cdot Dr(X) dX \quad (3)$$

The detection result of the number of killer defects λ is stored into a killer defect memory unit 27.

Figure 11A:
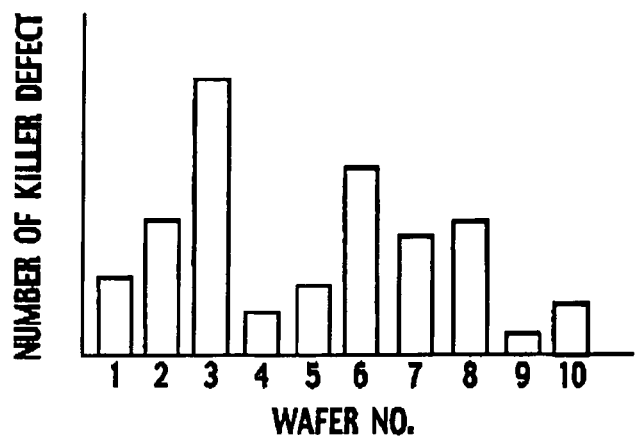
FIG. 11A is a graph illustrating a number of killer defects for each wafer number calculated by the system for reviewing the defect according to the third embodiment of the present invention.

The killer defect classification module 134 classifies on the basis of the detection result of the number of killer defects λ of the killer defect computing module 133, as shown in FIG. 11A, the number of killer defects λ included in a plurality of wafers by each wafer number. The classification result is stored into the classification memory unit 24. The review target selection module 135 selects on the basis of the review conditions stored in the condition memory unit 20 and the classification result stored in the classification memory unit 24, as shown for example in FIG. 11B, the review targets in descending order from wafers with a large number of killer defects λ, and stores the result into the review target memory unit 25.

Figure 11B:
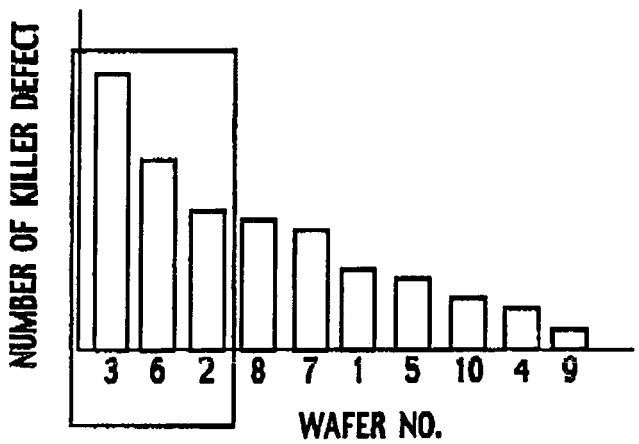
FIG. 11B is a graph illustrating a classification result in order of decreasing the number of killer defect for each wafer number calculated by the system according to the third embodiment of the present invention.
Figure 11C:
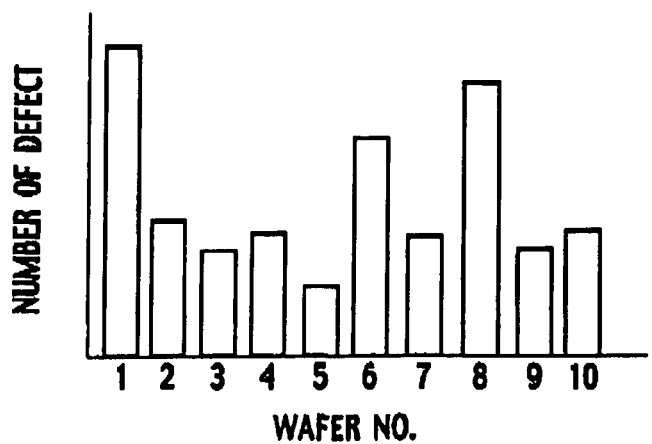
FIG. 11C is a graph illustrating a classification result of the number of defects for each wafer number inspected by a review execution unit.

FIG. 11C shows an example of the number of defects for each wafer that has been detected at the inspection after the fabrication process. From the example of FIG. 11C it can be understood that the most defects are in the order of numbers 1, 8 and 6. On the other hand, from FIG. 11B, where the respective classification is performed under consideration of failures due to killer defects, it can be understood that in the order of Nos. 3, 6 and 2 the number of killer defects increases. Therefore, by the extraction and review of Nos. 3, 6 and 2 the wafers with the most killer defects can be reviewed fast and with high efficiency.

Figure 12:
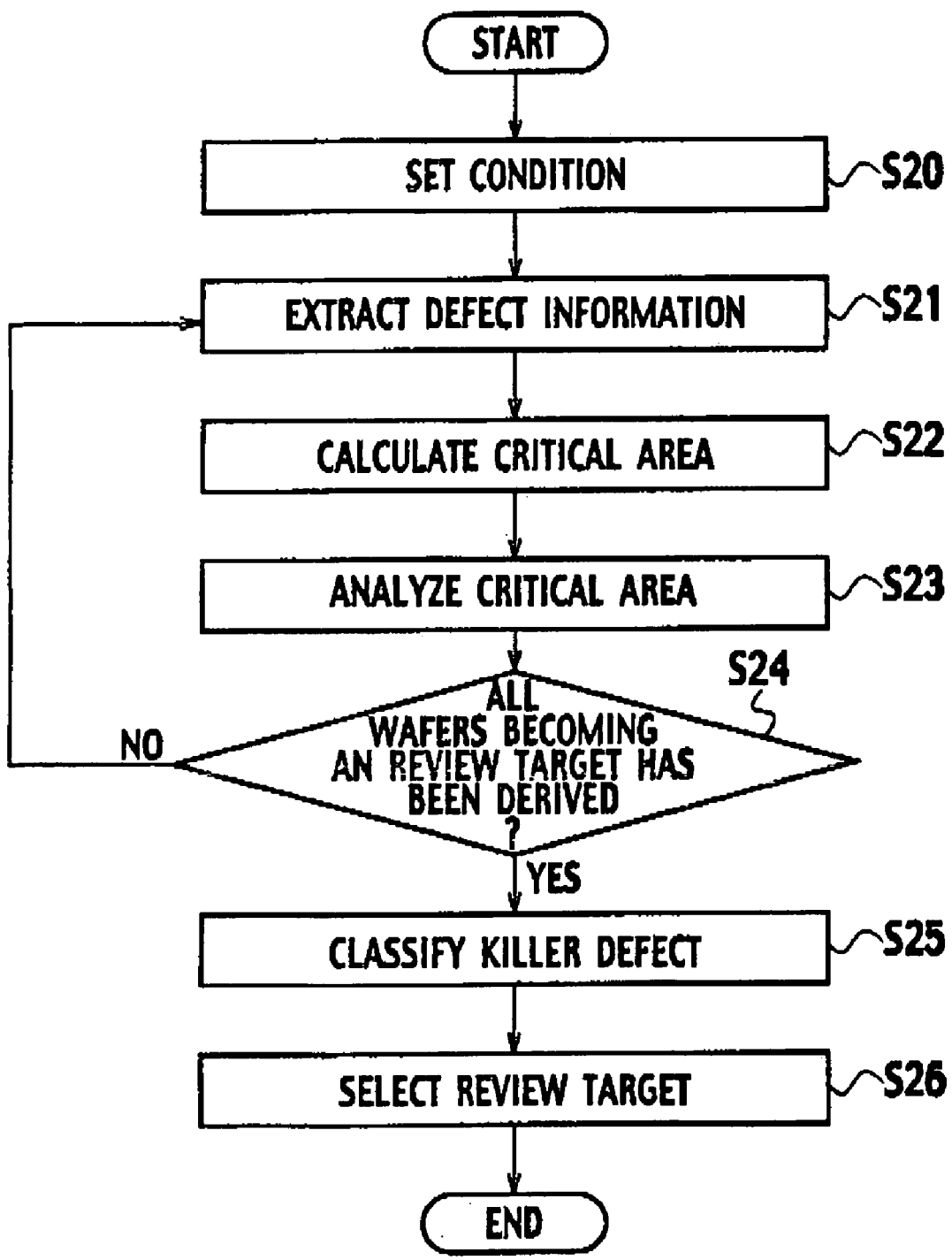
FIG. 12 is a flowchart illustrating a method for receiving defects according to the third embodiment of the present invention.

The defect review method according to the third embodiment is now explained by means of the flowchart of FIG. 12.

In step S20 of FIG. 4, the conditions for the review target, the number of samples, the inspection target domain and area thereof, and the like, requested by the user, and the analysis conditions and the like, which are necessary for the selection of the review target, are inputted into the CPU 1 through input unit 4. Here, the case is explained, where the user selects "failure due to killer defect" as review target. The condition setting module 10 sets all kinds of conditions, which are necessary for the defect analysis, and stores the setting result into the condition memory unit 20. Furthermore, the condition setting module 10 extracts defects from all points on each wafer, requires the defect size classification Dr(X) for each wafer, as shown in FIG. 2B, and stores them into the defect information memory unit 21.

In step S21, the defect information extraction module 131 extracts the information of the defect size distribution Dr(X) of the wafers stored within the defect information memory unit 21. Here, it is assumed that the defect information extraction module 131 has extracted the defect size distribution $Dr_1(X)$ of wafer No. 1 shown in FIG. 10A.

In step S22, the critical area calculation module 132 calculates the critical area Ac(X) of the wafer based on the information of the defect size distribution $Dr_1(X)$ and the analysis information stored within the analysis memory unit 22, and stores the calculation result into the critical area memory module 26.

In step S23, the killer defect computing module 133 reads out the critical area Ac(X) and the defect size distribution Dr(X), which is stored within the defect information memory unit 21, and computes the number of killer defects λ by using the equation (3) as shown in FIG. 10B. The computing result is stored into the killer defect memory unit 27.

In step S24, the defect information extraction module 131 reads out the number of killer defects λ stored in the killer defect memory unit 27 and evaluates whether or not the number of killer defects λ has been derived for all wafers becoming a review target. When all are done the operation proceeds to step S25, when not done the operation proceeds to step S21.

In step S25, the killer defect classification module 134 reads out the number of killer defects λ stored in the killer defect memory unit 27, and classifies per wafer the number of killer defects λ as shown in FIG. 11A. The classification result is stored into classification memory unit 24.

In step S26, the review target selection module 135 reads out the number of samplings stored within the condition memory unit 20 and the classification result stored within the classification memory unit 24. The review target selection module 135 selects as review targets on the basis of the classification result, as shown in FIG. 11B, in descending order from wafers with a large number of killer defects λ, for example the three wafers No. 3, 6 and 2 and stores the selection result into the review target memory unit 25.

According to the method for reviewing the defect of the third embodiment, the distribution of the number of killer defects λ contained within the intermediate product are obtained by employing the critical area Ac(X), which depends on the defect size of the intermediate product and the equation (3), and the defect review targets are selected in descending order from the number of killer defects λ. Therefore, the killer defects and the fabrication process, which becomes the cause for the occurrence of killer defects, can be predicted most likely in an early stage, thereby enhancing the yield. Furthermore, the defect review system shown in FIG. 8 comprises a systematic failure detection module 11 detecting systematic failures, and the defect detection module 13 detecting killer defects contained within an intermediate product. Consequently, in compliance with the kind of intermediate product, the process and the like, the user can freely select either to perform the killer defect inspection or the systematic failure inspection. Thus, the system with a high grade of liberty for selecting a review objective in compliance with the requirements of the user and a method therefore, can be provided.

Method for Fabricating Electronic Devices

Figure 13:
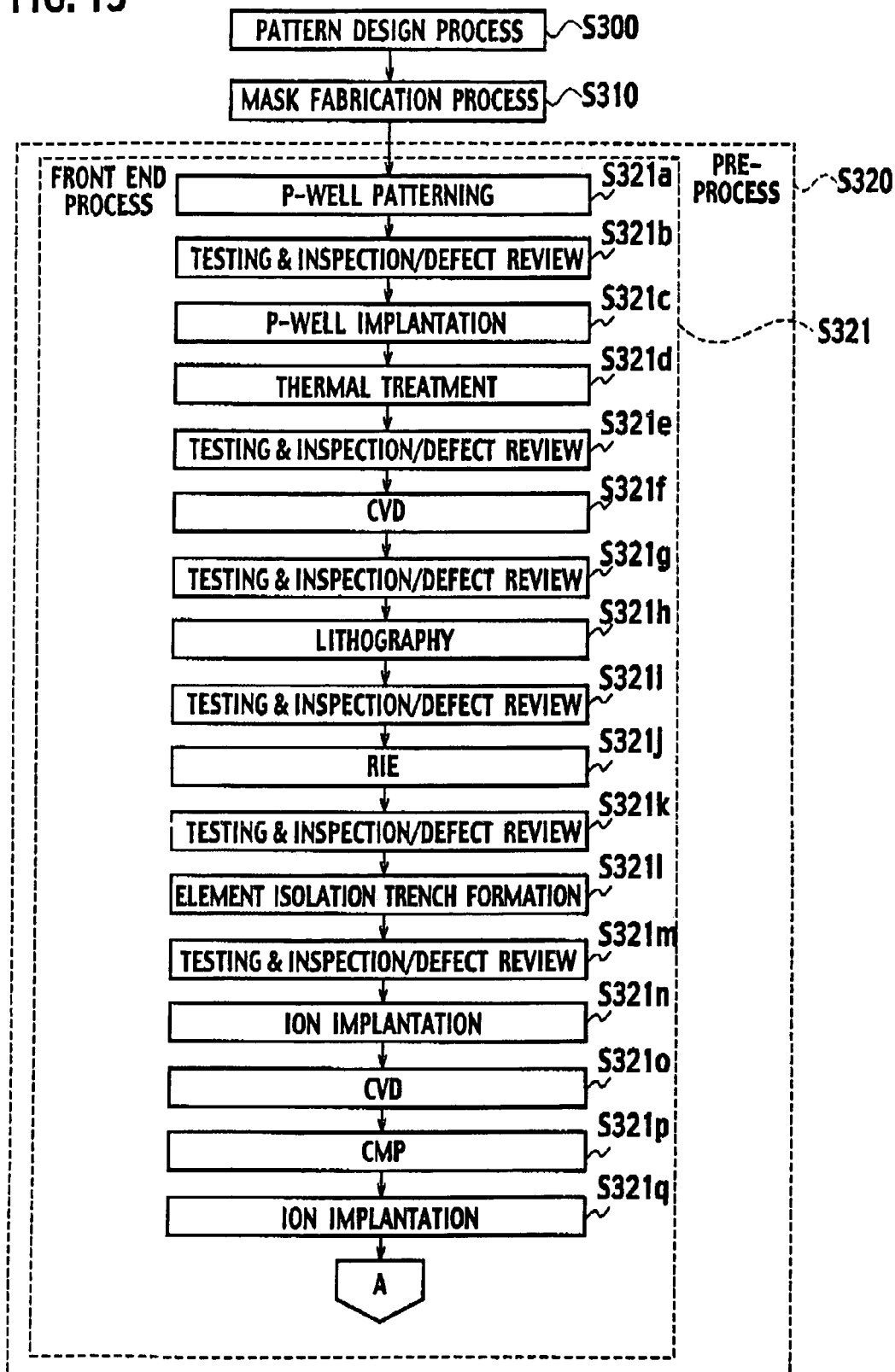
FIG. 13 is a flowchart illustrating a method for fabricating electronic devices according to the present invention.
Figure 14:
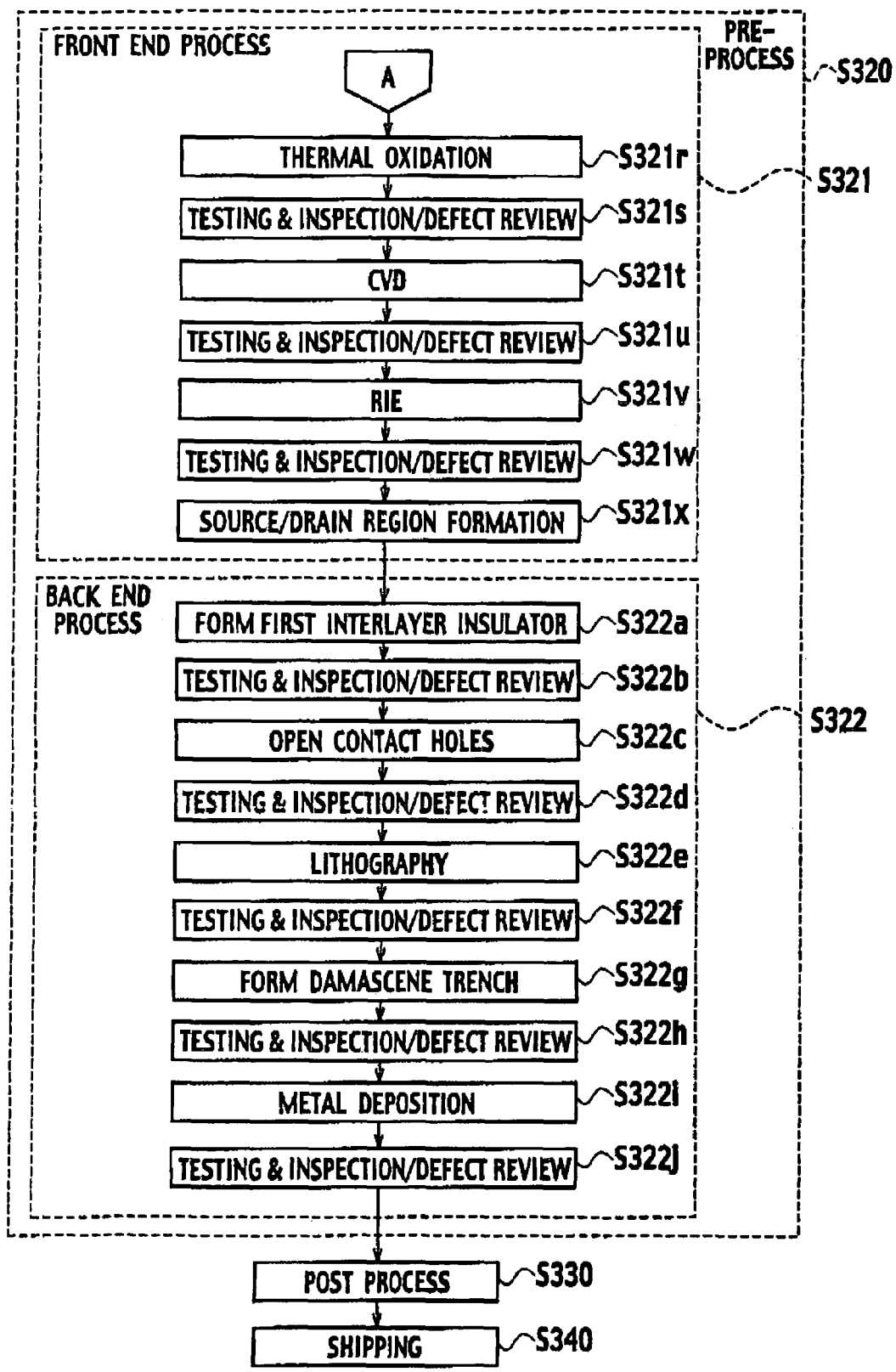
FIG. 14 is a flowchart illustrating the method for fabricating the electronic devices according to the present invention.

Next, with reference to FIGS. 13 and 14, the method for fabricating electronic devices according to an embodiment of the present invention is described. The method as described below, explains as an example a semiconductor integrated circuit of a CMOS structure, however, it goes without saying that besides the fabrication method of the semiconductor integrated circuit, the method can be applied to the fabrication method for many electronic devices.

The method for fabricating the electronic devices according to the embodiment of the present invention includes, as shown in FIG. 13, a pattern design process step S300, a mask fabrication process procedure S310, a pre-processing procedure S320 and a post-processing procedure S330, and proceeds then to the shipping process S340. Usually, the preparatory stage ends with the mask fabrication process procedure S310. After that, as shown in a sequence of steps S321a to S321x and S322a to S322j, a fabrication inspection stage, building a pair of a successive fabrication process and an inline-inspection for inspecting the result of this fabrication process, is sequentially repeated.

The system and method for reviewing the defect according to the first to third embodiment can be performed to the respective inline-testing/inspection process. In the following an example is shown, where the above described method is applied after the inspection of the planar pattern shape and dimension of an intermediate product formed and processed from a prospective process base, i.e. after an inspection process such as a p-well source/drain region patterning, an element separating region patterning and a wiring patterning. Here, the "intermediate product" is continually changing to a "new intermediate product" during the proceeding of the fabrication process, such that it is defined as the base being the object of the respective operating process. However, the term "wafer" is employed so as to represent "intermediate product" in the following explanation.

In step S300, a mask is designed by the CAD system, and in step S310 a set of masks (reticle) of the necessary number is manufactured. A silicon wafer is taken as a process base (mother material), and after the forming of a thermal oxidation film ($SiO_2$) on the main surface of the process base, in step S321a, a photoresist film is coated. The photoresist film is delineated by a photolithography technique and a p-well formation region is opened. A plurality of wafers with an opened p-well formation region is defined as the intermediate products. Then, in step S321b, by means of an inspection unit, defects of the planar pattern form, dimension and the like of the plurality of wafers, are evaluated with regard to inspection points predetermined for each wafer. The defect size distribution Dr(X) as shown in FIG. 2B is obtained for each wafer, respectively, and taken as defect information.

As shown in step S10 of FIG. 4, the failure information obtained by the condition setting module 10 of FIG. 1 is saved into the defect information memory unit 21. In step S11, the defect information extraction module 111 extracts the conditions necessary for the defect information analysis. In step S12, the analysis module 112 reads out the information of the defect size distribution $Dr_1(X)$ shown in FIG. 2C and the analysis equation shown by equation (1), which is stored within the condition memory unit 20 and analyses the fitting function $DL_1(X)$ as shown in FIG. 2D. In step S13, the failure magnitude calculation module 113 calculates the magnitude of systematic failures due to the fabrication procedure conducted on the wafers on the basis of the analysis result and defect information of the analysis module 112. In step S14 the calculation of the magnitude of systematic failures is performed for all wafers, becoming review targets. In step S15, the classification module 114 classifies by wafer numbers the magnitude of the systematic failures calculated by the failure magnitude calculation module 113, The review target selection module 115 selects the wafers to be reviewed in descending order of the magnitude of systematic failures on the basis of the review conditions, such as the number of samplings and the like, which are stored within the condition memory unit 20, and the classification result, classified by the classification module 114. For the selected wafers are once more inspected by the inspection unit. When the inspection of step S321b is passed, the fabrication procedure proceeds to step S321c.

In step S321c, boron ion ($B^+$) is ion implanted through the thermal oxidation film into the p-well formation region. The photoresist film is removed, and the p-well is formed through an annealing process (thermal diffusion) of the implanted boron ions after a prescribed cleaning process. Then, after the removal of the thermal oxidation film from the main surface of the wafer (separation), a thermal oxidation film is formed on the main surface of the wafer in step S321d. In step S321e, the inspection unit inspects the film thickness of the thermal oxidation film formed on the wafer according to inspecting points predetermined for each wafer. The film thickness distribution as shown in FIG. 2B is obtained for each wafer, respectively, and is taken as defect information.

As shown in step S10 of FIG. 4, the condition setting module of FIG. 1 stores the defect information of the film thickness of the inspected thermal oxidation film into the defect information memory unit 21. In step S11, the defect information extraction module 111 extracts the conditions necessary for the analysis of the defect information and in step S12, the analysis module 112 analyses the analysis equation on the basis of the defect information. In step S13, the failure magnitude calculation module 113 calculates the systematic failure magnitude occurred in the formation process of the thermal oxidation film on the basis of the analysis result of the analysis module 112 and the defect information. In step S14, the calculation of the systematic failure magnitude is performed for all wafers becoming inspection targets. In step S15, the classification module 114 classifies per wafer the systematic failure magnitude calculated by the failure magnitude calculation module 113. The review target selection module 115 selects the wafers to be reviewed on the basis of the review conditions such as the number of samplings and the like, stored within the condition memory unit 20, and the classification result of the failure magnitude classified by the classification module 114. For the selected wafers are inspected in detail by the inspection unit. When the inspection of step S321e is passed, the fabrication proceeds to step S321f.

In step 321f, a nitride film is developed on the thermal oxidation film by chemical vapor deposition (CVD). Next, in step S321g, the film thickness of the nitride film formed on the wafer is evaluated with regard to inspection points predetermined for each wafer. The film thickness distribution as shown in FIG. 2B for each wafer, respectively, is obtained and is taken as defect information. Following the flow chart shown in FIG. 4, the wafers becoming the review targets are selected and the selected wafers are reviewed. Since the inspection and the defect review method in step S321g are substantially the same as in step S321e, a repetition thereof is omitted. For the selected wafers once more inspected in detail by the inspection unit. When the inspection of step S321g is passed, the fabrication proceeds to step S321h.

In step S321h, a photoresist film delineated by a photolithography technique is formed on the nitride film. Next, in step S321i, the inspection unit inspects defects of the pattern shape and dimension of the photoresist film formed on the wafer with regard to inspection points predetermined for each wafer. The defect size distribution Dr(X) as shown in FIG. 2B, is obtained for each wafer, respectively, and is taken as defect information. Then, the review execution unit shown in FIG. 1 selects the wafers becoming review targets, following the flow chart shown in FIG. 4, and reviews. For the selected wafers are inspected in detail by the inspection device. When the inspection of step S321i is passed, the fabrication proceeds to step S321j.

Sequentially, in step S321j, reactive ion etching (RIE) with the photoresist film formed on the wafer as mask is coated, and the nitride film is delineated so as to define element isolation trench formation region. Next, in step S321k, the inspection unit evaluates the shape and dimension of the patterns delineated on the wafer with regard to preset inspection points, and extracts the defect information. Thereafter, the defect review following the flow chart in FIG. 4 is performed. In step S321l, one part of the main surface of the wafer is etched so as to form element isolation trenches. By this process the element formation regions and the element isolation trenches may be defined alternatively. At this timing, the element formation regions are coated by the nitride film. Thereafter, the photoresist film employed for the selective etching of the nitride film is removed. In step S321m, the inspection unit inspects the pattern shape and dimension of the element isolation trenches formed on the wafer, and the defect review following the flow chart shown in FIG. 4 is performed.

Next, in step S321n, impurity ions for preventing formation of inversion layer are implanted into the bottom of the above mentioned element isolation trenches, and in step S321o, an oxidation layer is embedded into the element isolation trenches by employing the CVD. Sequentially, in step S321p the nitride film is planarized on the main surface of the layer as a stopper by chemical mechanical polishing (CMP) Then, after the removal of this nitride film, a dummy oxidation film is formed on the element forming region, where after in step S321q, a gate threshold voltage control (Vth control) ion implantation is performed. Thereafter, the dummy oxidation film used as a protection film at the time of the Vth control ion implantation is separated. Then, in step S321r of FIG. 14, a thermal oxidation is performed, forming a gate oxidation film. In step S321a, the inspection unit evaluates defects such as pattern shape and dimension of the gate oxidation film formed on the wafer for preset inspection points for each wafer. The defect size distribution Dr(X) as shown in FIG. 2B for each wafer, respectively, is obtained and is taken as defect information. Then, the defect review unit shown in FIG. 1 performs the defects review according to the flow chart shown in FIG. 4.

Next, in step S321t, a poly silicone film is formed on the upper part of the gate oxidation film in a CVD furnace. Then, on the poly silicone film a photoresist film is delineated by the photolithography technique. Next, in step S321u, the inspection unit evaluates defects such as registration, dimension and the like of the photoresist film formed on the wafer for preset inspection points for each wafer, and the defect review unit shown in FIG. 1 performs the defect review of the photoresist film formed on the wafer according to the flow chart shown in FIG. 4. The registration is a measure of the overlay accuracy from layer to layer. In step S321v, gate electrodes and a poly silicone wiring is RIE etched, whereas the photoresist film is used as a mask. Thereafter, the photoresist film is removed. Sequentially, in step S321w, the pattern dimension and registration of the gate electrodes and the poly silicone wiring is inspected, and the defects contained in the inspection result are reviewed. In step S321x, a source/drain region is formed by the photolithography technique on the wafer.

Next, in step S322a, a first interlayer dielectric film is stacked by way of CVD for the insulation between poly silicone films, which form a first metal interconnect for connecting between the transistor and the gate electrodes. Then, in step S322b, the film thickness of the first interlayer dielectric film is inspected. Next, in step S322c, a photoresist film is delineated by a photolithography technique on the first interlayer dielectric film. Next, in step S322d, the inspection and defect review of the film thickness of the photoresist film is performed. In step S322e, sequentially, RIE is performed with the photoresist as a mask, and contact holes penetrating the source/drain region throughout the first interlayer insulating film. Next, in step S322f the dimension of the contact holes is inspected.

In the following likewise, the forming of the damascene grooves in step S322g, the inspection in step S322h and the metal stacking in step S322i are performed. In step S322j the inspection and defect review is performed using the defect information obtained on the basis of the inspection result. Furthermore, by planarization of the surface of the first interlayer dielectric film employing the CMP, by embedding Cu into the inner part of the contact holes and the inner part of the damascene grooves, and by stacking thereon a second interlayer insulation film employing the CVD, a serial multi-level interconnect is formed. Onto the upper layer of the metal wiring a passivation film is laminated as the top layer for the prevention of mechanical damages and the invasion of moisture and impurities.

When the structuring and inspection of the multi-level interconnect is finished, it is divided into chips of a determined size in step S330. Then the chips are mounted onto a packaging material, and the electrode pad above the chips is connected to the lead of the lead frame. After that the packages are assembled, and after the characteristics inspection and the like with regard to the fabrication/function of semiconductor devices, the electronic devices are completed. In step S340 the electronic devices, which have cleared all steps as mentioned above, are packed such as to protect them from moisture, electrostatics and the like, and are shipped as products.

By the fabrication method for electronic devices according to the embodiments of the present invention, significant defects from out of inspected defects can be determined and reviewed fast and with high efficiency. Thereby, the fabrication yield of electronic devices can be improved.

Other Embodiments

Various modifications will become possible for those skilled in the art after receiving the teachings of the present disclosure without departing from the scope thereof.

In the embodiments of the present invention, for example, the system and method for reviewing defects in wafers has been described, however, the present invention is not limited to wafers used in semiconductor devices. It goes without saying that it can be utilized in fabrication procedures for industrial product where a sample is taken from a universe and is inspected, such as the fabrication procedure of, i.e. liquid crystal devices, magnetic memory medium, laser memory medium, thin film magnetic head, superconductive elements and the like. It can be easily understood that the inspection method of the present invention can be applied, for example, to the fabrication procedure of thin film magnetic heads, in which a few processes such as a CVD similar to the semiconductor integrated circuit, a process of photolithography, a process of etching and the like are repeated.

What is claimed is:

1. A system for reviewing defects comprising:
   a memory storing defect information of a plurality of intermediate products and an analysis equation comparing random and systematic failures, using a fitting function to evaluate a random failure magnitude caused by a fabrication procedure of the intermediate products;
   an analysis module incorporated in a computer readable medium, analyzing the defect information using the analysis equation, the defect information including information of an amount of defects classified by sizes of the defects existing in each of the intermediate products, respectively;
   a failure magnitude calculation module incorporated in a computer readable medium, calculating a systematic failure magnitude of the intermediate products caused by the fabrication procedure of the intermediate products using the analysis equation and the analyzed result of the defect information;
   a classification module incorporated in a computer readable medium, classifying a calculated result of the systematic failure magnitude with respect to each of the intermediate products; and
   a review target selection module incorporated in a computer readable medium, selecting intermediate products becoming review targets, based on a classified result,
   wherein the failure magnitude calculation module calculates a difference between the defect information and the analyzed result by the fitting function.

2. The system of claim 1, further comprising:
   a review execution unit reviewing the review targets, the review targets being selected so as to include a plurality of intermediate products having the highest systematic failure magnitude and the lowest systematic failure magnitude; and
   a cause detection module incorporated in a computer readable medium, detecting a failure cause of the intermediate products based on a reviewed result of the review targets.

3. The system of claim 1, wherein the review targets are made from one of semiconductor substrates, liquid crystal substrates, resin substrates, piezoelectric substrates, and superconductive substrates.

4. The system of claim 1, further comprising:
   a killer defect detection module incorporated in a computer readable medium, detecting a number of the killer defects by using the defect information and the analyzed result by the analysis equation.

5. The system of claim 4, further comprising:
   a critical area calculation module incorporated in a computer readable medium, calculating a critical area of the intermediate products by using the defect information and the analysis equation;
   a killer defect computing module incorporated in a computer readable medium, computing a number of the killer defects by using the calculated critical area and the defect information; and
   a killer defect classification module incorporated in a computer readable medium, classifying the detected number of the killer defects,
   wherein the review target selection module selects the review targets in descending order from the intermediate product with a largest number of the killer defects.

6. The system of claim 5, further comprising:
   a review execution unit reviewing the review targets; and
   a cause detection module incorporated in a computer readable medium, detecting a failure cause of the intermediate products based on a reviewed result of the review targets.

7. A method for reviewing defects, comprising:
   using a computer processor to analyze defect information of a plurality of intermediate products by using an analysis equation including a fitting function evaluating a random failure magnitude caused by a fabrication procedure of the intermediate products, the defect information including information of an amount of defects classified by sizes of the defects existing in each of the intermediate products, respectively;
   calculating a systematic failure magnitude of the intermediate products caused by fabrication procedure of the intermediate products by using the analysis equation and the analyzed result of the defect information;
   classifying a calculated result of the systematic failure magnitude with respect to each of the intermediate products; and
   selecting intermediate products becoming review targets, based on a classified result,
   wherein classifying the calculated result of the systematic failure magnitude includes calculating a difference between the defect information and the analyzed result by the fitting function.

8. The method of claim 7, further comprising:
   reviewing the review targets, the review targets being selected so as to include a plurality of intermediate products having the highest systematic failure magnitude and the lowest systematic failure magnitude; and
   detecting a failure cause of the intermediate products based on a reviewed result of the review targets.

9. A method for fabricating electronic devices, comprising:
   conducting a fabrication procedure on a plurality of process bases so as to provide a plurality of intermediate products;
   inspecting a plurality of inspection points allocated on the intermediate products so as to extract defects;
   generating defect information by classifying sizes of the defects existing in each of the intermediate products, respectively;
   using a computer processor to analyze the defect information by using an analysis equation including a fitting function evaluating a random failure magnitude caused by a fabrication procedure of the intermediate products, calculating a systematic failure magnitude of the intermediate products caused by the fabrication procedure, classifying a calculated result of the systematic failure magnitude of intermediate products, selecting a plurality of intermediate products becoming review targets;
   reviewing the review targets; and
   determining whether or not the intermediate products undergo a next stage of the fabrication procedure based upon the reviewed result, wherein classifying the calculated result of the systematic failure magnitude includes calculating a difference between the defect information and the analyzed result by the fitting function.

10. The method of claim 9, wherein the review targets are selected so as to include a plurality of intermediate products having the highest systematic failure magnitude and the lowest systematic failure magnitude.

11. The method of claim 9, wherein the process bases include semiconductor substrates, liquid crystal substrates, resin substrates, piezoelectric substrates, and superconductive substrate.

12. The method of claim 9, wherein the fabrication procedure include one of an etching, a planarization, a lithography, and a deposition.

* * * * *